US006465043B1

(12) United States Patent
Gupta

(10) Patent No.: US 6,465,043 B1
(45) Date of Patent: *Oct. 15, 2002

(54) METHOD AND APPARATUS FOR REDUCING PARTICLE CONTAMINATION IN A SUBSTRATE PROCESSING CHAMBER

(75) Inventor: Anand Gupta, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/599,230

(22) Filed: Feb. 9, 1996

(51) Int. Cl.$^7$ ................. C23C 16/00; C23C 16/40; C23C 16/455; C23C 16/585
(52) U.S. Cl. ............ 427/255.37; 427/579; 427/255.28; 427/255.29; 427/255.5; 427/569; 438/787; 438/788; 438/789
(58) Field of Search ................. 427/574, 579, 427/255.3, 255.5, 255.37, 255.31, 255.29, 255.28, 569; 437/238; 438/787, 788, 789

(56) References Cited

U.S. PATENT DOCUMENTS

| 4,260,647 | A | * | 4/1981 | Wang et al. ................ 427/579 |
| 4,761,219 | A | | 8/1988 | Sasaki et al. .............. 204/298 |
| 4,795,529 | A | | 1/1989 | Kawasaki et al. .......... 156/643 |
| 4,871,416 | A | | 10/1989 | Fukuda ...................... 156/635 |
| 4,872,947 | A | * | 10/1989 | Wang et al. ................ 427/574 |

(List continued on next page.)

FOREIGN PATENT DOCUMENTS

| DE | 4128779 | 8/1991 | ............. C23F/4/00 |
| EP | 0425419 | 2/1991 | ............ C23C/16/50 |
| EP | 0453780 | 10/1991 | ............. H01J/37/32 |
| JP | 60-42831 | 8/1983 | ......... H01L/21/302 |
| JP | 61-196538 | 2/1985 | ......... H01L/21/302 |
| JP | 63-1035 | 6/1986 | ......... H01L/21/302 |

OTHER PUBLICATIONS

Selwyn et al., "In–situ Particulate Contamination Studies in Process Plasmas", *SPIE Conference Proc.*, pp. 1–12, (Oct. 1989).

Selwyn, "Laser Diagnostic Techniques for Reactive Ion Etching: Plasma Understanding to Process Control", *J. Vac. Sci. Technol. A*, vol. 6, No. 3, pp. 2041–2046, (May /Jun. 1988).

"IBM Reveals Design for Self–Cleaning Tools", *Semiconductor International*, p. 46, (Sep. 1991).

Selwyn et al., "In Situ Plasma Contamination Measurements by HeNe Laser Light Scattering: A Case Study", *J. Vac. Sci. Technol. A*, vol. 8, No. 3, p. 1726 (May/Jun. 1990).

*IBM Technical Disclosure Bulletin*, vol. 34, No. 11, pp. 237–238, (Apr. 1992).

Selwyn, "Plasma Particulate Contamination Control 1. Transport and Process Effects", *J. Vac. Sci. Technol. B.*, vol. 9, No. 6, pp. 3487–3492, (Nov./Dec. 1991).

Selwyn et al., "Plasma Particulate Contamination Control: II. Self Cleaning Tool Design", *Journal of Vacuum Technology A (Vacuums, Surfaces and Films)*, vol. 10, No. 8, pp. 1053–1059, (Jul. 1992).

*Primary Examiner*—Marianne Padgett
(74) *Attorney, Agent, or Firm*—Townsend & Townsend and Crew

(57) ABSTRACT

A method and apparatus for reducing particle contamination in a substrate processing chamber during deposition of a film having at least two layers. The method of the present invention includes the steps of introducing a first process gas into a chamber to deposit a first layer of the film over a wafer at a first selected pressure, introducing a second process gas into the chamber to deposit a second layer of the film over the wafer, and between deposition of said first and second layers, maintaining pressure within the chamber at a pressure that is sufficiently high that particles dislodged by introduction of the second process do not impact the wafer.

16 Claims, 4 Drawing Sheets

U.S. PATENT DOCUMENTS

| | | | |
|---|---|---|---|
| 4,951,601 A | 8/1990 | Maydan et al. | 118/719 |
| 4,976,996 A * | 12/1990 | Monkowski et al. | 427/255.7 |
| 4,985,112 A | 1/1991 | Egitto et al. | 156/643 |
| 4,985,372 A | 1/1991 | Narita | 437/192 |
| 5,043,300 A | 8/1991 | Nulman | 437/200 |
| 5,083,865 A | 1/1992 | Kinney et al. | 356/338 |
| 5,089,441 A | 2/1992 | Moslehi | 437/225 |
| 5,102,496 A | 4/1992 | Savas | 156/643 |
| 5,143,866 A | 9/1992 | Matsutani | 437/187 |
| 5,271,972 A * | 12/1993 | Kwok et al. | 427/579 |
| 5,286,518 A * | 2/1994 | Cain et al. | 427/579 |
| 5,328,555 A | 7/1994 | Gupta | 156/643 |
| 5,393,708 A * | 2/1995 | Hsia et al. | 437/228 |
| 5,420,044 A * | 5/1995 | Kozuka | 427/579 |
| 5,426,076 A * | 6/1995 | Moghadarn | 437/238 |
| 5,427,621 A | 6/1995 | Gupta | 134/1 |
| 5,456,796 A | 10/1995 | Gupta et al. | 156/643.1 |

* cited by examiner

METHOD AND APPARATUS FOR REDUCING PARTICLE CONTAMINATION IN A SUBSTRATE PROCESSING CHAMBER

CROSS-REFERENCE TO RELATED APPLICATIONS

This application is related to concurrently filed U.S. Ser. No. 08/599,270 entitled "METHOD AND APPARATUS FOR IMPROVING THE FILM QUALITY OF PLASMA ENHANCED CVD FILMS AT THE INTERFACE", having Anand Gupta, Virendra V. S. Rana, Amrita Verma, Mohan Bhan and Subrahmanyam Sudhakar listed as co-inventors; and concurrently filed U.S. Ser. No. 08/599,279 entitled "METHOD AND APPARATUS FOR REDUCING PARTICLE GENERATION BY LIMITING DC BIAS SPIKE", having Anand Gupta, Stefan Wolfe and Maria Galiano listed as co-inventors. Each of the above referenced applications are assigned to Applied Materials Inc, the assignee of the present invention, and each of the above referenced applications are hereby incorporated by reference.

BACKGROUND OF THE INVENTION

The present invention relates to the fabrication of integrated circuits. More particularly, the invention provides a technique, including a method and apparatus, for reducing particle contamination during substrate processing. The present invention is particularly useful for chemical vapor deposition processing, but may also be applied to plasma etching and other substrate processing techniques.

One of the primary steps in the fabrication of modern semiconductor devices is the formation of a thin film on a semiconductor substrate by chemical reaction of gases. Such a deposition process is referred to as chemical vapor deposition or "CVD". Conventional thermal CVD processes supply reactive gases to the substrate surface where heat-induced chemical reactions take place to produce a desired film. The high temperatures at which some thermal CVD processes operate can damage device structures having metal layers.

One particular thermal CVD process that has been developed to deposit insulation films over metal layers at relatively low, nondamaging temperatures includes deposition of a silicon oxide layer from TEOS and ozone precursor gases. Such a TEOS/ozone silicon oxide film may be deposited under carefully controlled pressure conditions in the range of between about 100–700 torr, and is therefore commonly referred to as a subatmospheric CVD (SACVD) film. The high reactivity of TEOS with ozone reduces the energy required for a chemical reaction to take place, and thus lowers the required temperature for such SACVD processes.

Another CVD method of depositing layers over metal layers at relatively low temperatures includes plasma enhanced CVD (PECVD) techniques. Plasma CVD techniques promote excitation and/or disassociation of the reactant gases by the application of radio frequency (RF) energy to a reaction zone proximate the substrate surface, thereby creating a plasma of highly-reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called "Moore's Law") which means that the number of devices which will fit on a chip doubles every two years. Today's wafer fabrication plants are routinely producing 0.5 and even 0.35 micron feature size devices, and tomorrow's plants soon will be producing devices having even smaller geometries.

As device sizes become smaller and integration density increases, one issue that has become increasingly important is the ability of a deposited insulating layer to fill closely spaced gaps (referred to as a film's "gap fill" capability) such as those between adjacent metal lines. Because of their different, yet complimentary film characteristics, one process that has been used successfully to fill gaps up to an aspect ratio of 2.0 or higher, is the deposition of a three layer silicon oxide dielectric film in which a thin PECVD silicon oxide layer is deposited over stepped topography (such as adjacent metal lines) of a substrate, as an initial lining layer and diffusion barrier for an SACVD TEOS/ozone silicon oxide layer that fills in the gaps between the metal lines. A compressively stressed PECVD silicon oxide layer is then deposited over the SACVD layer prevent moisture absorption in the SACVD layer and to counteract the tensile stress of the SACVD layer ensuring that the film has a low compressive stress. The entire deposition sequence takes place in an in situ process.

Another concern in the manufacture of high density integrated circuits are contaminant particles. In particular, contaminant particles attach themselves to unpassivated elements of integrated circuit devices during fabrication, where they can create short circuits or cause reliability or other problems. Therefore, the contaminant particles ultimately reduce the yield of good dies on a conventional semiconductor wafer. Even worse, as feature sizes decrease, the influence of contaminant particles in the fabrication of integrated circuits becomes greater.

Accordingly, semiconductor equipment vendors and users, alike, often rely upon elaborate and expensive techniques to control potential sources of contaminant particles. Such techniques include the use of ultra-clean rooms, super automated handling equipment, and sophisticated process controls during the fabrication of integrated circuits to reduce the potential sources of contaminant particles. However, such techniques can only be of limited success because substantial amounts of contaminant particles in integrated circuit fabrication are actually derived from reactant by-products created when semiconductor wafers undergo processing.

These reactant by-products often attach themselves to interior surfaces of a process chamber and form into a contaminant residue layer. Typically, the contaminant residue layer is derived from by-products of reactant gases and other by-products already attached to interior surfaces of the process chamber. Portions of the contaminant residue layer can flake off and deposit onto unpassivated surfaces of the integrated circuit.

To prevent portions of the contaminant residue layer from damaging the integrated circuit, a variety of cleaning techniques have been used. Some of these cleaning techniques require separate process steps, which include machine shutdown and cleaning, after each deposition step. This is time consuming, expensive, and difficult to achieve. Additionally, when a processing machine is not operating, wafer throughput on the fabrication line drops, rendering the manufacturing process all the more expensive.

In another cleaning technique, referred to as plasma enhanced dry cleaning, an etchant gas, such as fluorine, is introduced into the chamber during a separate cleaning step.

A plasma is formed from the etchant gas and constituents from the plasma react with and remove the deposited material from the chamber walls and other areas. Such cleaning procedures commonly need to be performed after every deposition run or after every several deposition runs to be effective in keeping the interior surfaces of the process chamber substantially free from contaminant residues and particles.

In the exemplary PECVD/SACVD/PECVD three layer film described above, a dry cleaning step may be performed after deposition of the SACVD layer to reduce particle contamination. That is, after deposition of the SACVD silicon oxide layer of the film, the wafer is removed without breaking vacuum seal and the chamber is evacuated to pump out remaining gases and loose particles. Next, a fluorine etch step is performed to clean the chamber and remove contaminants and other residue that has built up within the chamber. The etch step includes increasing chamber pressure during the etching process and reevacuating the chamber after completion of the process. Upon completion of the etch step, the wafer is loaded back into the chamber and deposition of the PECVD film is initiated.

Without such a dry clean step, particles tend to build up and collect on the chamber walls and in areas such as the perforated holes of the gas dispersion manifold after deposition of the SACVD layer. The particles built up within the perforated holes may be later forced out of the holes and deposited onto the wafer when the PECVD deposition gases are introduced into the evacuated chamber as described in more detail below. The use of a clean step between the SACVD and PECVD depositions, however, consumes processing time and reduces wafer throughput. Also, the clean step can, in itself, be a source of particle accumulation. Measurements show that particles which may cause contamination problems may build up during this process even in spite of the clean step between depositions. Thus, from the above it can be seen that new methods of reducing particle contamination are desirable.

SUMMARY OF THE INVENTION

The present invention addresses the above problems of the prior art by providing a method and apparatus for reducing particle contamination in instances where two or more successive layers of a film are deposited by an in situ process in a substrate processing system. The method of the present invention eliminates the need for a clean step between deposition of the successive layers and does not substantially increase processing time.

In one embodiment of the method of the present invention, a first process gas is introduced into the chamber to deposit a first layer of a film over a substrate at a first selected chamber pressure and a second process gas is introduced into the chamber to deposit a second layer of the film over the first layer. In between deposition of the first and second layers, the pressure of the chamber is maintained at a level that is sufficiently high to prevent a substantial number of particles dislodged by introduction of the second process gas from impacting the substrate.

In a preferred version of this embodiment, particles deposited in perforated holes of a gas distribution manifold through which the first and second process gases are introduced are prevented from impacting the substrate, and pressure in the chamber is maintained at a level greater than or equal to about 1 torr between deposition of the first and second layers.

In another preferred embodiment, the first process gas includes TEOS and ozone and the first pressure level is between about 100–700 torr. Also, the second layer of the film is deposited from a plasma of the second process gas which includes TEOS and an oxygen containing source.

For a further understanding of the objects and advantages of the present invention, reference should be made to the ensuing detailed description taken in conjunction with the accompanying drawings.

DETAILED DESCRIPTION OF THE PREFERRED EMBODIMENT

I. Exemplary CVD System

Figure 1:
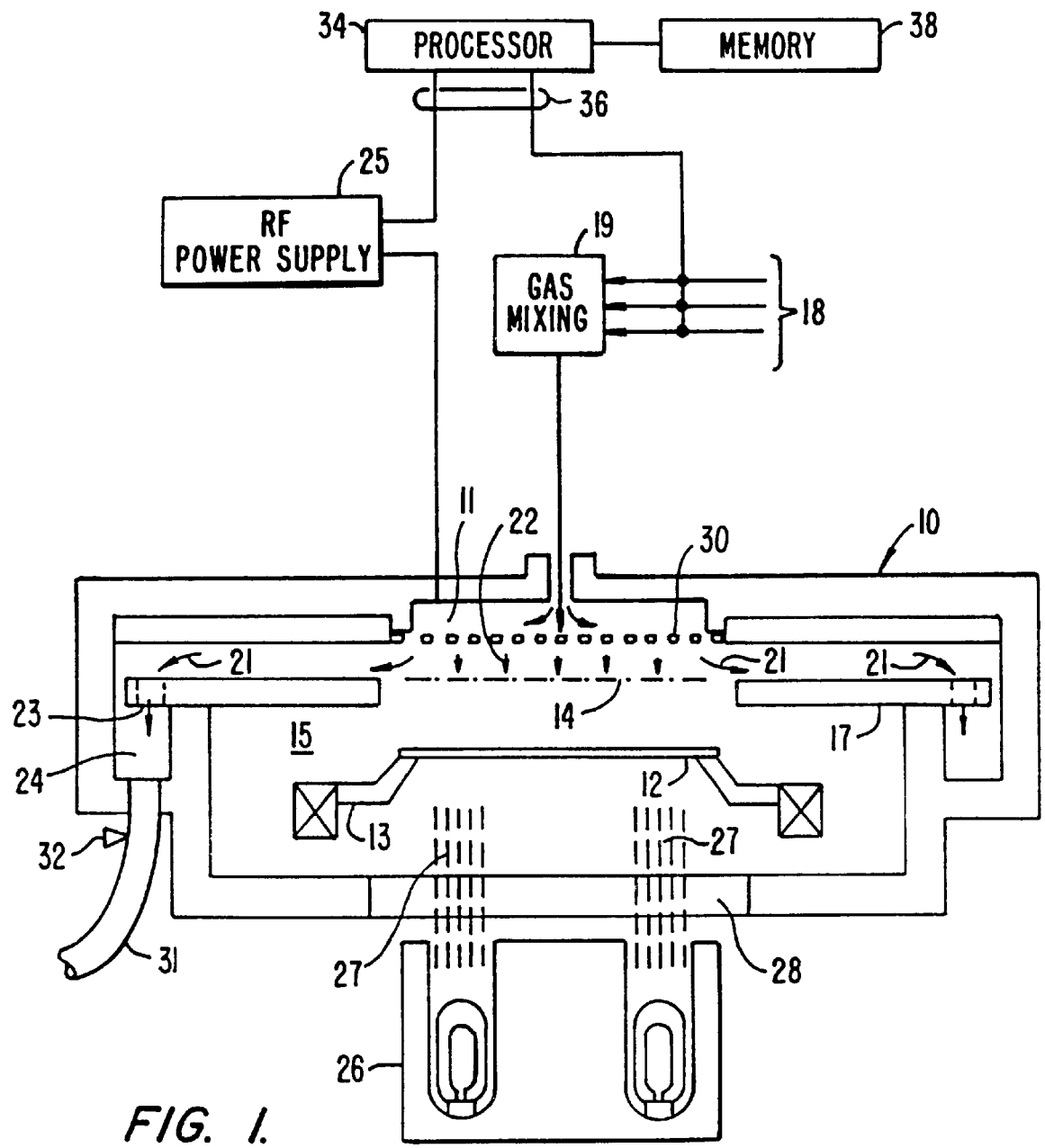
FIG. 1 is a cross-sectional diagram of an exemplary CVD processing chamber used according to one embodiment of the present invention.

One suitable CVD machine in which the method of the present invention can be carried out is shown in FIG. 1 which is a vertical, cross-sectional view of a simplified, parallel plate chemical vapor deposition reactor 10 having a vacuum chamber 15. Reactor 10 contains a gas distribution manifold 11 for dispersing deposition gases through perforated holes in the manifold to a wafer, not shown, that rests on a susceptor 12. Susceptor 12 is highly thermally responsive and is mounted on a support fingers 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate having a plurality of spaced holes 23 which exhaust into an annular vacuum manifold 24. During processing, gas inlet to manifold 11 is uniformly distributed radially across the surface of the wafer in a laminar flow as indicated by arrows 21. The gas is then exhausted via ports 23 into the circular vacuum manifold 24 by a vacuum pump system (not shown). Before reaching manifold 11, deposition and carrier gases are input through gas lines 18 into a mixing system 19 where they are combined and then sent to manifold 11.

The deposition process performed in reactor 10 can be either a thermal process or a plasma enhanced process. In a plasma process, a controlled plasma is formed adjacent to the wafer by RF energy applied to distribution manifold 11 from RF power supply 25 (with susceptor 12 grounded). Gas distribution manifold 11 is also an RF electrode, while susceptor 12 is grounded. RF power supply 25 can supply either single or mixed frequency RF power to manifold 11 to enhance the decomposition of reactive species introduced into chamber 15.

An external lamp module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition.

Typically, any or all of the chamber lining, gas inlet manifold faceplate, support fingers 13, and various other reactor hardware is made out of material such as aluminum or anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention, which is incorporated herein by reference for all purposes.

A motor 32 raises and lowers susceptor 12 between a processing position 14 and in a lower, wafer-loading position. Motor 32, gas mixing system 19 and RF power supply 25 are controlled by a processor 34 over control lines 36. Processor 34 operates under the control of a computer program stored in a memory 38. The computer program dictates the timing, mixture of gases, RF power levels, susceptor position, and other parameters of a particular process.

The above CVD system description is mainly for illustrative purposes, and other plasma CVD equipment such as electron cyclotron resonance (ECR) plasma CVD devices, induction coupled RF high density plasma CVD devices, or the like may be employed. Additionally, variations of the above described system such as variations in susceptor design, heater design, location of RF power connections and others are possible. For example, the wafer could be supported and heated by a resistively heated susceptor. The layer and method for forming such a layer of the present invention is not limited to any specific apparatus or to any specific plasma excitation method.

II. Exemplary Structure

Figure 2:
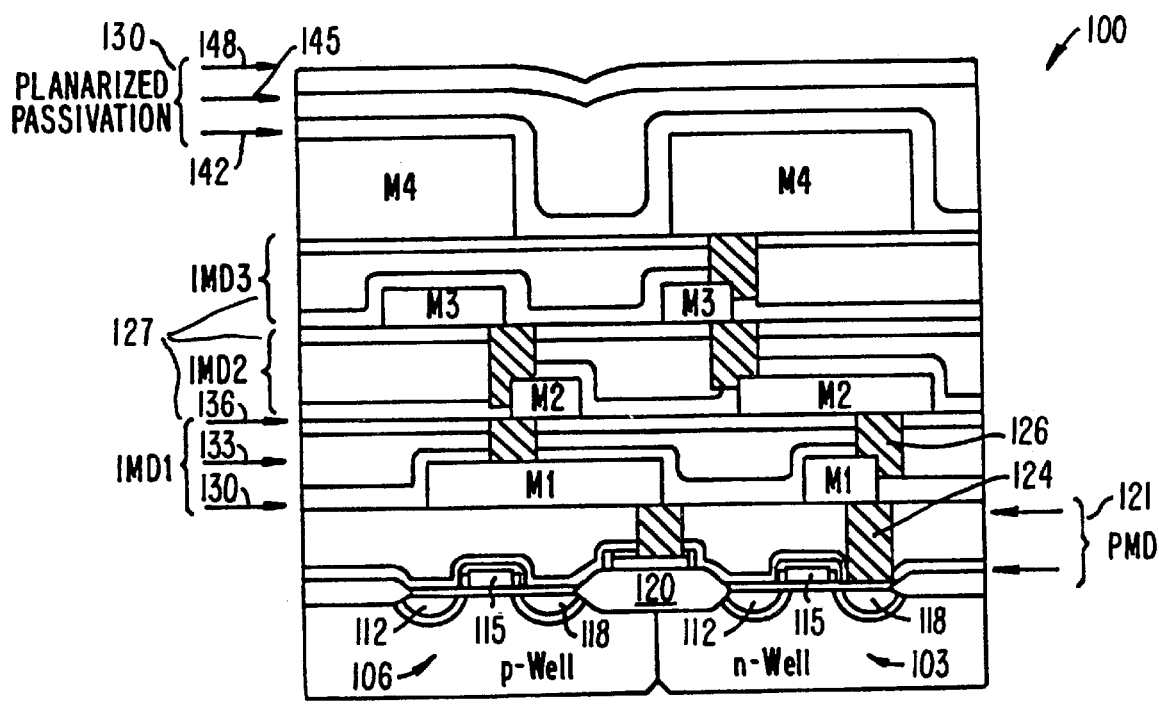
FIG. 2 is a simplified cross-sectional view of an integrated circuit 600 according to the present invention.

FIG. 2 illustrates a simplified cross-sectional view of an integrated circuit 100 according to the present invention. As shown in FIG. 2, integrated circuit 100 includes NMOS and PMOS transistors 103 and 106, which are separated and electrically isolated from each other by a field oxide region 120. Each transistor 103 and 106 comprises a source region 112, a drain region 115 and a gate region 118.

A premetal dielectric layer 121 separates transistors 103 and 106 from metal layer M1 with connections between metal layer M1 and the transistors made by contacts 124. Metal layer M1 is one of four metal layers, M1–M4, included in integrated circuit 100. Each metal layer M1–M4 is separated from adjacent metal layers by respective intermetal dielectric layers 127 (IMD1, IMD2 and IMD3). IMD layers 127 may include a lining layer 130, a gap fill layer 133 and a cap layer 136. Adjacent metal layers are connected at selected openings by vias 126. Deposited over metal layer M4 are planarized passivation layers 139. Similar to IMD layers 127, passivation layer 139 may include a lining layer 142, a gap fill layer 145, and a cap layer 148.

The layer of the present invention may find uses in each of the dielectric layers shown in integrated circuit 100. The layer of the present invention may also be used in damascene layers which are included in some integrated circuits. In damascene layers, a blanket layer is deposited over a substrate, selectively etched through to the substrate and then filled with metal and etched back or polished to form metal contacts such as M1. After the metal layer is deposited, a second blanket deposition is performed and selectively etched. The etched areas are then filled with metal and etched back or polished to form vias 126.

It should be understood that the simplified integrated circuit 100 is for illustrative purposes only. One of ordinary skill in the art could implement the present method for fabrication of other integrated circuits such as microprocessors, application specific integrated circuits (ASICS), memory devices, and the like.

III. Reducing Particle Contamination in a Substrate Processing Chamber

The present invention may be employed to reduce particle contamination in an in situ process in a substrate processing chamber such as the exemplary chamber described above. One specific application of the present invention is for the deposition of an IMD layer such as any one of layers 127 shown in FIG. 2 above. In this specific application, the method of the present invention is employed to deposit a three layer (PECVD/SACVD/PECVD) silicon oxide film. An initial PECVD layer is deposited as lining layer 130. Lining layer 130 acts as a diffusion barrier between gap fill layer 133 and a respective underlying metal layer M1–M3. The SACVD layer is then deposited over layer 130 to fill the gaps between adjacent metal lines in the respective metal layer M1–M3. Afterwards, a final PECVD layer 136 is deposited to form a cap over SACVD layer 133 preventing that layer from absorbing moisture and counteracting the SACVD layer's tensile stress level.

Figure 3:
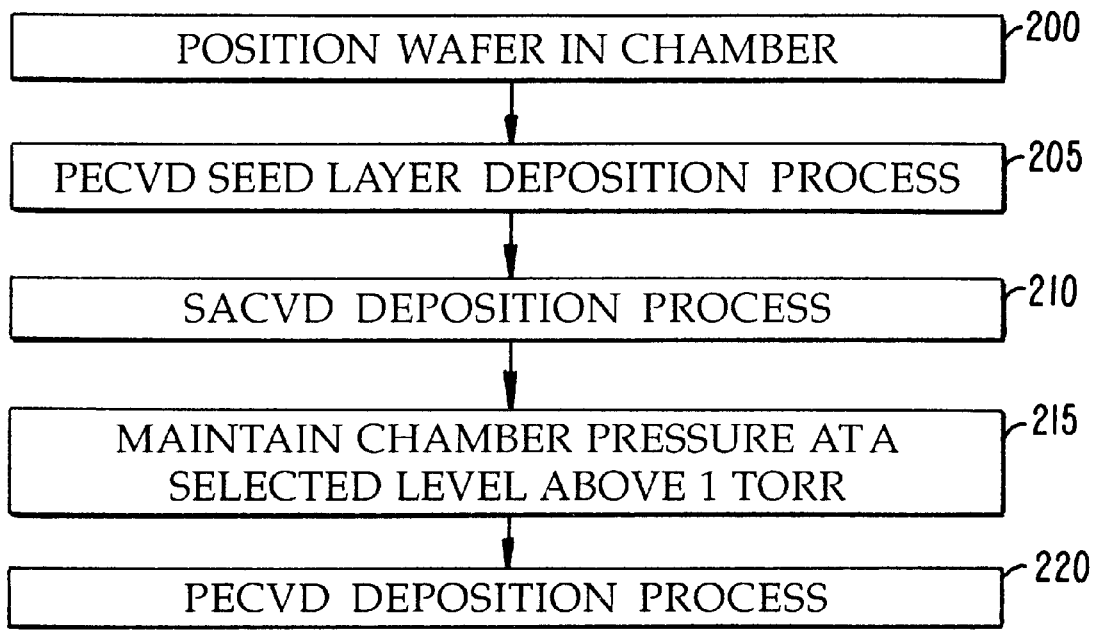
FIG. 3 is a flowchart illustrating steps undertaken in formation of a film according to one embodiment of the method of the present invention.

To form the PECVD/SACVD/PECVD film according to the present invention, the wafer is loaded in vacuum chamber 15 through a vacuum-lock door, placed onto susceptor 12 and moved into processing position 14 (FIG. 3, step 200). A process gas that includes a mixture of TEOS and oxygen ($O_2$) precursor gases is introduced into chamber 15 and a plasma is formed to deposit initial PECVD layer 130 (step 205). During deposition of layer 130, the pressure in the chamber is set and maintained at between about 1–20 torr and the chamber is heated to a temperature of between about 200–500 degrees Celsius. Preferably, chamber pressure is maintained at between about 6–12 torr and temperature is maintained at between about 360–440 degrees Celsius. The plasma may be formed by the application of either single or mixed frequency RF power. When a mixed frequency RF power source is used, the high frequency RF source of 13.56 MHz is driven at between about 150–1000 Watts and preferably at between about 600–800 Watts; and a low frequency RF source of between about 200 KHz to 2 MHz as driven at between about 50–500 Watts and preferably at between about 50–150 Watts.

After deposition of layer 130, a new process gas is introduced into the chamber, while temperature, pressure and other processing conditions are controlled to deposit SACVD silicon oxide layer 633 (step 210). This process gas includes a mixture of ozone, TEOS and an inert carrier gas such as helium; deposition temperature is maintained at between about 300–480 degrees Celsius and preferably at between about 380–420 degrees Celsius; and deposition pressure is maintained at between about 200–700 torr and preferably at between about 350–500 torr. Of course, processing conditions will vary according to the desired characteristics of the deposited film.

After deposition of the SACVD layer is complete, pressure within chamber 15 is maintained at a level greater than or equal to about 1.0 torr and the wafer is left in the chamber (step 215). Preferably, pressure is maintained at a level between the pressure used during deposition step 210 and 220, and most preferably pressure is decreased during step 215 from the pressure level used in step 210 to about the level used in subsequent PECVD processing step 220 while helium or another inert gas is introduced into the chamber. The rate at which pressure is decreased in step 215 can vary and can be 100 torr/second or more.

Next, a process gas including silicon and oxygen precursor gases is introduced into chamber 15 and a plasma is formed to deposit PECVD capping layer 136 (step 215). Again, chamber pressure, temperature and other variables are controlled as appropriate. In this example, pressure in the chamber is set and maintained at between about 1–20 torr and temperature is set and maintained at between about 200–500 degrees Celsius. Preferably, pressure is maintained at between about 6–12 torr and temperature is maintained at between about 360–440 degrees Celsius. Any increase or decrease in pressure from step 215 is preferably performed at a rate of change less than about 2 torr/second so as to not generate large DC bias spikes and thereby reduce particle formation (step 305) as described in more detail in applicants' copending patent application entitled "Method and Apparatus For Reducing Particle Generation By Limiting DC Bias Spike" previously mentioned. The plasma may be formed by the application of either single or mixed frequency RF power. When a mixed frequency RF power source is used, the high frequency RF source of 13.56 MHz is driven at between about 150–1000 Watts and preferably at between about 600–800 Watts; and a low frequency RF source of between about 200 KHz to 2 MHz as driven at between about 50–500 Watts and preferably at between about 50–150 Watts.

Figure 4A:
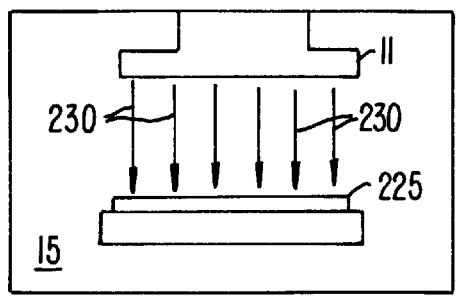
FIG. 4(a) is a cross-sectional diagram of a CVD processing chamber showing how particles forced out of holes in the gas distribution manifold may impact a wafer being processed.

The above process differs from previously implemented multi layer PECVD/SACVD/PECVD silicon oxide processes in that chamber 15 is not evacuated to almost vacuum levels (millitorr range) after completion of the SACVD deposition step. This difference is significant in that particles from the SACVD deposition step tend to build up and collect in perforated holes of the gas dispersion manifold and other areas. When the chamber is evacuated to a pressure in the millitorr range and new deposition gases or other gases are introduced for the PECVD deposition step, these particles are forced out of the holes. Because of the low chamber pressure, the gas flow at this point is not yet established as a uniform, laminar flow and there is little or no drag force on the forced-out particles. Thus, as shown in FIG. 4(a), the particles may impact the surface of wafer 225 upon being dislodged from dispersion manifold 11 as indicated by arrows 230. The effect is sufficiently pronounced that particles on the surface of the wafer can be observed in the pattern of the dispersion manifold through the use of a wafer surface scanner such as the Tencor 6200 manufactured by Tencor Instruments.

Figure 4B:
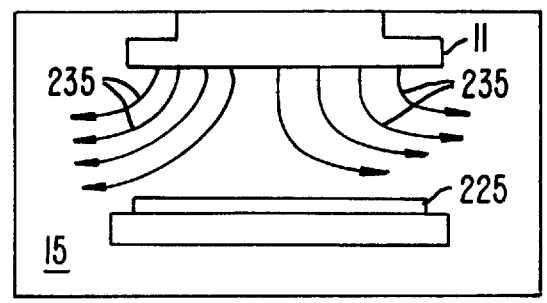
FIG. 4(b) is a cross-sectional diagram of a CVD processing chamber showing the effect of the present invention on particles forced out of holes from the gas distribution manifold.

The method of the present invention maintains the pressure at or above a level at which a laminar gas flow is established upon introduction of the PECVD gases and at which sufficient drag is exerted on the particles forced out of the dispersion head such that the particles do not impact the wafer when gases are reintroduced into the chamber. Instead, as shown by arrows 235 in FIG. 4(b), most of these particles pass along with the gas stream in a laminar flow above the surface of the wafer and out the exhaust port into the foreline without impacting the wafer. This process is sufficiently effective that the need for a dry clean step between the SACVD and PECVD processing steps is eliminated.

Eliminating the clean step saves processing time and increases throughput. As previously described, the use of a typical clean step between depositions requires evacuating the chamber, removing the wafer from the chamber, introducing an etchant gas and forming a plasma from the gas to etch the chamber, removing the etchant species, and then reintroducing the wafer into the chamber. This sequence of steps may require between about 60–150 seconds or more to execute. In contrast, the transition between SACVD deposition step 210 and PECVD deposition step 220 can take place in as few as 2–10 seconds according to the present invention. The total time it takes to transition from step 210 to step 220 will vary according to, among other factors, the deposition pressure during the SACVD step, the rate at which pressure is decreased and the pressure level used to ensure a sufficient drag force is exerted on dislodged particles.

Further particle reduction can be ensured by careful control of other processing parameters. Such steps can be performed in conjunction with or in lieu of step 215. In one example, deposition of the PECVD layer shown in step 220 of FIG. 3 is performed by a five-step process shown detail in FIG. 5. In this example, oxygen in the form of $O_2$ is initially introduced into the chamber before other deposition gases (step 300). After several seconds an inert gas such as helium is introduced and pressure in the chamber is slowly increased, or decreased as appropriate (step 305), at a rate of change of 1 torr per second. Other rates may be used as well, but preferably pressure is increased or decreased at a rate of about 2 torr/second or less.

Next, RF power is applied and ramped up to full power (the power level at which the RF power supply is driven at during step 315) at a rate of about 50 Watts/second (step 310). Other rates may be used as well, but preferably RF power is increased at a rate of 200 Watts/second or less. After full RF power has been reached, TEOS is introduced into the chamber to effect deposition of the silicon oxide layer (step 315). Processing conditions are maintained for a selected period of time during deposition to deposit a layer having a desired thickness.

After deposition is complete, the TEOS/helium flow is stopped, chamber pressure is decreased at a rate of about 1 torr/second and RF power is decreased at a rate of about 50 Watts/second to a level sufficient to maintain the plasma. Other rates of pressure and RF power decrease may be used as well, but preferably pressure is decreased at a rate of 2 torr/second or less and RF power is decreased at a rate of 200 Watts/second or less. Oxygen flow is also increased at this time to help purge particles from the chamber (step 320). As described in more detail in U.S. Pat. No. 5,622,595, entitled REDUCING PARTICULATE CONTAMINATION DURING SEMICONDUCTOR DEVICE PROCESSING by A. Gupta and J. Lanucha, issued Apr. 22, 1997, and assigned to Applicants, which is hereby incorporated by reference, reducing pressure within the chamber results in particles suspended in the plasma rising closer to the gas distribution manifold and further from the upper surface of the wafer. Thus, the suspended particles are in effect lifted up into or closer to the maximum flow path of the increased $O_2$ flow which helps ensure that the particles will be swept out of the chamber. After the chamber has been purged, $O_2$ flow is stopped and the chamber is evacuated (step 325).

Figure 5:
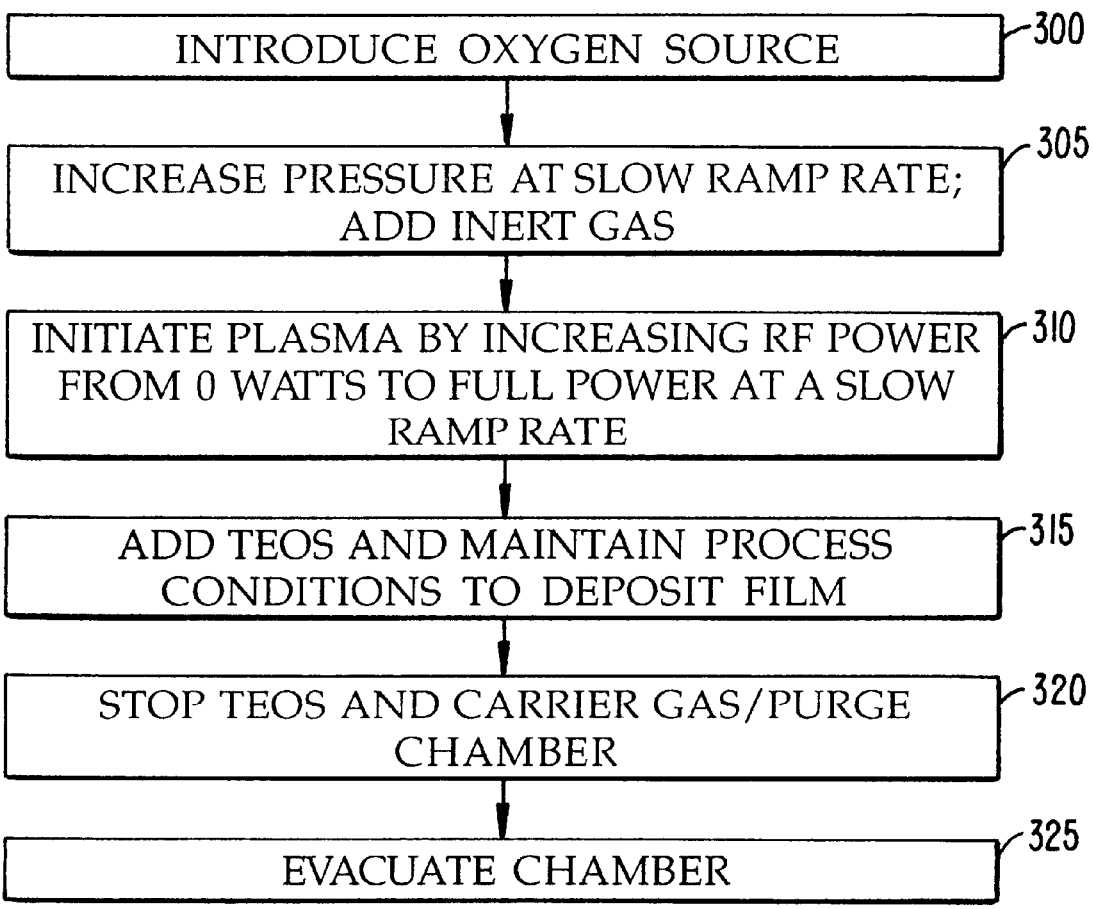
FIG. 5 is a flowchart illustrating steps undertaken in formation of one embodiment of the PECVD film deposition step shown in FIG. 2.

In one preferred embodiment of the PECVD process illustrated in FIG. 5 and implemented in a DxZ chamber outfitted for 200 mm wafers in a Precision 5000 processing system manufactured by Applied Materials, oxygen is introduced in step 300 at a rate of 600 sccm. Then, after 8 seconds, helium is introduced into the chamber at a rate of 800 sccm for step 305 and the rate at which $O_2$ is introduced is decreased to 50 sccm. During this period, processor 34 controls throttle valve 32 to increase pressure within the chamber to 8.2 torr. Approximately 10 seconds after the introduction of helium, RF power (13.56 MHz) is increased from 0 Watts to 725 Watts at a rate of 50 Watts/second for step 310.

Step 315 is initiated 20 seconds after the start of step 310 when full RF power has been reached and maintained for about 5.5 seconds. In step 315, TEOS is combined with the helium flow and introduced into the chamber at a rate of 800 sccm and the oxygen flow rate is increased to 600 sccm. This step is maintained for a selected period of time to deposit a silicon oxide layer having a desired thickness. After deposition is substantially complete, the TEOS/helium flow is stopped, RF power is decreased to 50 Watts at a rate of decrease of 150 Watts/second for step 320 and chamber pressure is decreased to 2 torr at a rate of 1 torr/second. The rate at which $O_2$ is introduced into the chamber is also increased at this time to 2000 sccm to help ensure that particles are pumped out of the chamber. Approximately 6 seconds later in step 325, the introduction of $O_2$ is stopped and the chamber is evacuated.

The above parameters set forth as one preferred version of the PECVD recipe are meant to serve exemplary purposes only. A person of skill in the art will recognize that gas introduction rates, time periods and other conditions may be varied and that some parameters such as gas introduction rates and RF power levels will depend in part on chamber volume.

Another method of further reducing particles includes the step of lowering the susceptor during or just before step 320 from its processing position to a position where the surface of the wafer is resting below the point at which exhaust gases are pumped out of the chamber as shown in FIGS. 5(a) and (b). Lowering the wafer in this manner helps ensure that particles will not impact the wafer when the particles are purged from the chamber in step 320 and 325.

Figure 6A:
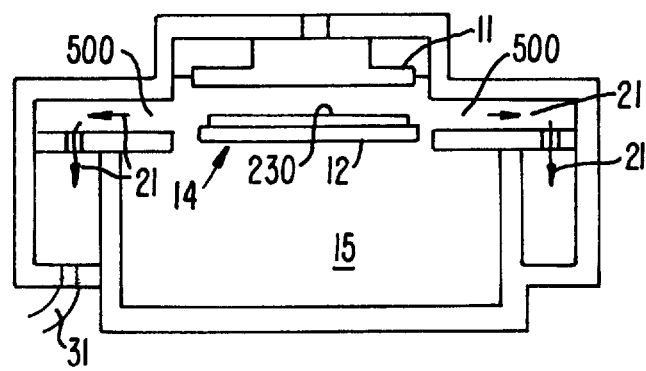
FIGS. 6(a) and 6(b) are cross-sectional diagrams of a CVD processing chamber illustrating the position of the wafer relative to a purge gas ring in different processing steps of a preferred embodiment of the present invention.

In FIG. 6(a), wafer 230 is sitting on susceptor 12 in processing position 14. In this position, the upper surface of the wafer is above the lower surface of exhaust ring 500. In a preferred embodiment where the previously described exemplary chamber is used, position 14 is between approximately 200–400 mils from the gas distribution manifold. Such positioning provides for more uniform deposition on the wafer.

Figure 6B:
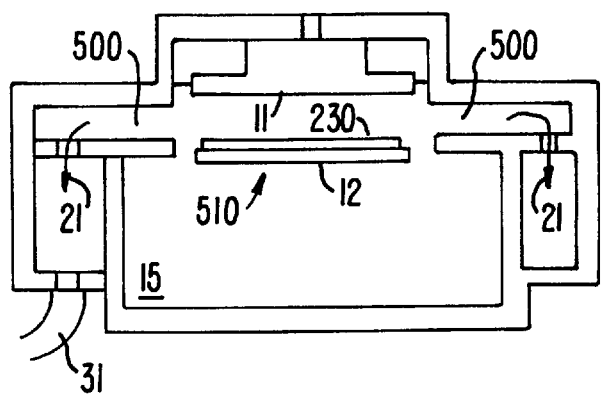

As shown in FIG. 6(b), however, the wafer is moved to a position 510 such that the upper surface wafer is slightly below or just even with the lower portion of exhaust ring 500. In a preferred embodiment where the previously described exemplary chamber is used, position 510 is between approximately 470 mils or more from the gas distribution manifold. Such positioning lessens the chance that any individual particle pumped out of the chamber during steps 320 and 325 will impact the wafer.

This step of lowering the wafer can also be performed as part of or in lieu of step 215 used to decrease the amount of particles that impact the wafer upon introduction of the PECVD process gas. Moving the wafer further away from the gas distribution manifold at this stage of processing increases the distance any individual particle must travel to impact the wafer, and therefore, decreases the chance of such a collision.

IV. Test Results and Measurements

To prove the effectiveness of the present invention, experiments were performed depositing various silicon oxide films with and without the benefits of the method of the present invention and measuring particle the particle count at various stages of processing. Particle counts were measured with a Tencor 6200 wafer surface scanner. The experiments were performed in a restively heated DxZ chamber outfitted for 200 mm wafers of the Precision 5000 processing system manufactured by Applied Materials.

In each experiment, a 5000 Å thick SACVD layer was deposited from TEOS and ozone precursor gases and a 5000 Å thick PECVD layer was deposited over the SACVD layer from TEOS and $O_2$ precursor gases.

In the first experiment, the PECVD layer was deposited immediately after deposition of the SACVD oxide layer and no clean sequence was performed between the two deposition steps. Measurements taken after the completion of the SACVD process and at the start of the PECVD process indicated that introduction of the PECVD process gas added 22 particles having a diameter greater than 0.21 micrometers into the chamber. Measurements taken after RF power was turned ON from 0 Watts to 725 Watts at a rate of 500 Watts/second to form the plasma in the PECVD step indicated that 158 particles were added during the RF ramp up sequence. Further measurements taken after completion of the PECVD layer indicated that the entire SACVD/PECVD process added 316 particles.

The same process was followed in a second experiment except that a dry clean step in which a mixture of $C_2F_6$ (introduced at 900 sccm), $O_2$ (introduced at 950 scm) and $NF_3$ (introduced at 75 sccm) was used to clean the chamber between the SACVD and PECVD deposition steps. The chamber was heated to 400 degrees Celsius for the clean step, and RF power was applied from a 13.56 MHz power supply driven at 950 Watts. Pressure in the chamber was set and maintained at 9.5 torr. After completion of the clean step, measurements indicated that 20 particles having a diameter greater than 0.21 micrometers were added.

In the third experiment, the SACVD layer was not followed by a clean step, and instead, the PECVD layer was deposited according to the steps illustrated in FIG. 5 using the gas flow rates and times described with respect to the preferred embodiment discussed in respect to that figure. Particle measurements taken after completion of this process indicate that the combined SACVD/PECVD process did not generate any significant number of particles of 0.21 micrometers in diameter or greater, and in fact, actually resulted in a net loss of 4 such particles.

Having fully described several embodiments of the present invention, many other equivalent or alternative methods of depositing the low dielectric constant oxide layer according to the present invention will be apparent to those skilled in the art. For example, while the invention was illustrated by a three layer in situ film, the present invention is applicable to any film that includes two or more layers deposited by an in situ process. Also, while the illustrated embodiments concerned a process using TEOS as a source of silicon and $O_2$ as a source of oxygen, it is possible to use other sources silicon sources such as silane, and other oxygen sources such as $N_2O$, CO or others. It is also possible to use additional dopant gases such fluorine, boron, phosphorus or other dopants and deposit different films, such as silicon nitride or others, altogether. For example, the present invention may be used to deposit a passivation layer such as layer 139 shown in FIG. 2. In this example, an initial PECVD oxide layer is deposited as lining layer 142, an SACVD TEOS/ozone layer is deposited as gap fill layer 145 and a silicon nitride layer is deposited as cap layer 148. These alternatives and equivalents along with others are intended to be included within the scope of the present invention.

What is claimed is:

1. A method of operating a substrate processing chamber, said method comprising steps of:
   (a) introducing a wafer into said chamber;
   (b) flowing a first process gas from a gas inlet into said chamber at a first selected pressure to deposit a first layer over said wafer;
   (c) flowing a second process gas from said gas inlet into said chamber to deposit a second layer over said (wafer) first layer, said second layer being deposited at a second selected pressure; and
   (d) flowing, after the step (b) and prior to the step (a), an intermediate gas from said gas inlet into said chamber at a selected intermediate chamber pressure and at an intermediate gas flow rate sufficient to maintain a laminar gas flow between said gas inlet and a chamber exhaust port.

2. The method of claim 1 wherein said selected intermediate pressure is greater than about 1 torr.

3. The method of claim 2 wherein said first selected pressure is greater than about 200 torr and said second selected pressure is less than about 20 torr.

4. The method of claim 1 wherein said intermediate gas comprises oxygen.

5. The method of claim 1 wherein said gas inlet comprises a gas distribution manifold.

6. The method of claim 2 wherein said first selected pressure is between about 100–700 torr.

7. The method of claim 1 wherein step (d) further includes applying RF power to said intermediate gas to form a plasma.

8. The method of claim 7 wherein said RF power is ramped to a preselected value at a rate less than about 200 watts per second.

9. The method of claim 8 wherein said rate is between about 100–200 watts per second.

10. The method of claim 1 wherein said second process gas comprises a first gas and a second gas.

11. The method of claim 1 further comprising steps of:
    flowing an initial process gas into said chamber; and
    forming an initial plasma from said initial process gas to deposit a lining layer on said substrate, said lining layer being deposited before said step (b).

12. The method of claim 1 wherein said wafer is moved away from said gas inlet after said step (b) of said deposition of said first layer.

13. The method of claim 12 wherein said wafer is moved toward said gas inlet after said wafer is moved away from said gas inlet and before said second process gas is flown into said chamber in said step (c).

14. The method of claim 1 wherein said second process gas comprises a silicon-containing source, an oxygen-containing source and an inert gas.

15. The method of claim 14 wherein said silicon-containing source comprises tetraethoxysilane (TEOS).

16. The method of claims 15 wherein said oxygen-containing source comprises $O_2$ and said inert gas comprises helium.

* * * * *

UNITED STATES PATENT AND TRADEMARK OFFICE
CERTIFICATE OF CORRECTION

PATENT NO.     : 6,465,043 B1
DATED          : October 15, 2002
INVENTOR(S)    : Gupta It is certified that error appears in the above-identified patent and that said Letters Patent is hereby corrected as shown below:

<u>Column 11,</u>
Line 25, delete "(a)" and replace with -- (c) --.

Signed and Sealed this

Eleventh Day of November, 2003

JAMES E. ROGAN
*Director of the United States Patent and Trademark Office*